(12) United States Patent
Inanami et al.

(10) Patent No.: US 8,227,151 B2
(45) Date of Patent: Jul. 24, 2012

(54) FLARE CORRECTION METHOD, METHOD FOR MANUFACTURING MASK FOR LITHOGRAPHY, AND METHOD FOR MANUFACTURING SEMICONDUCTOR DEVICE

(75) Inventors: Ryoichi Inanami, Yokohama (JP); Suigen Kyoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 196 days.

(21) Appl. No.: 12/868,779

(22) Filed: Aug. 26, 2010

(65) Prior Publication Data
US 2011/0065027 A1 Mar. 17, 2011

(30) Foreign Application Priority Data

Sep. 15, 2009 (JP) ................................. 2009-213488

(51) Int. Cl.
G03F 1/70 (2012.01)
G03F 7/20 (2006.01)
G06F 17/50 (2006.01)
(52) U.S. Cl. ................. 430/5; 430/30; 430/311; 716/51
(58) Field of Classification Search ................. 430/5, 30, 430/311; 716/51
See application file for complete search history.

(56) References Cited

FOREIGN PATENT DOCUMENTS
JP 2006-39060 2/2006
JP 2008-117866 5/2008

OTHER PUBLICATIONS

Word, et al., "Full Chip Model Based Correction of Flare-Induced Linewidth Variation", 24th Annual BACUS Symposium on Photomask Technology, Proceedings of SPIE, vol. 5567, pp. 700-710, (2004).

Primary Examiner — Mark F Huff
Assistant Examiner — John S Ruggles
(74) Attorney, Agent, or Firm — Finnegan, Henderson, Farabow, Garrett & Dunner, L.L.P.

(57) ABSTRACT

In one embodiment, a flare correction method is disclosed. The method can acquire a flare point spread function. The method can calculate a pattern density distribution in a first region of the mask, the distance from the pattern being equal to or shorter than a predetermined value in the first region. The method can calculate pattern coverage in a second region of the mask, the distance from the pattern being longer than the predetermined value. The method can calculate a first flare distribution with respect to the pattern by performing convolution integration between the flare point spread function corresponding to the first region and the pattern density distribution. The method can calculate a flare value corresponding to the second region by multiplying a value of integral of the flare point spread function corresponding to the second region by the pattern coverage. The method can calculate a second flare distribution by adding the flare value to the first flare distribution. In addition, the method can correct the pattern based on the second flare distribution.

12 Claims, 9 Drawing Sheets

FLARE VALUE OF
SHORT-DISTANCE REGION

FIG. 4A

FLARE VALUE OF
LONG-DISTANCE REGION

SHORT-DISTANCE COMPONENTS OF FLARE PSF
(GAUSSIAN FITTING)

FLARE CORRECTION METHOD, METHOD FOR MANUFACTURING MASK FOR LITHOGRAPHY, AND METHOD FOR MANUFACTURING SEMICONDUCTOR DEVICE

CROSS REFERENCE TO RELATED APPLICATION

This application is based upon and claims benefit of priority from the Japanese Patent Application No. 2009-213488, filed on Sep. 15, 2009, the entire contents of which are incorporated herein by reference.

FIELD

Embodiments described herein relate generally to a flare correction method, a method for manufacturing a mask for lithography, and a method for manufacturing a semiconductor device.

BACKGROUND

EUV (Extreme Ultra-Violet) lithography is expected as a method for forming finer patterns than patterns formed by conventional exposing light (193 nm or 248 nm in wavelength) on wafers, with the use of light (X rays) of a very short wavelength around 13.5 nm.

In an EUV exposure device, all the optical components of the optical system of illumination for EUV masks and the optical system for projections onto wafers are formed with the use of reflecting mirrors, because of the properties of EUV light with short wavelengths. Therefore, scattered light generated from EUV light is observed, depending on the flatness of the surface of each reflecting mirror. The scattered light is projected as stray light in a different form from the patterns to be exposed on wafers. Such stray light is called "flare".

To reduce the impact of flare, device manufactures have improved the flatness of each reflecting mirror in exposure devices. At the same time, to obtain a desired pattern size in a situation where flare exists, a flare correction to change the shape of the exposure pattern is effectively performed.

In a flare correction method, a pattern to be exposed is divided into meshes, and the pattern shape and size are corrected, with the flare amount in the patterns of each of the meshes being regarded as constant (see James Word, et al., "Full Chip Model Based Correction of Flare-Induced Linewidth Variation", Proceedings of SPIE, Vol. 5567, 2004, p.p. 700-710, for example). According to this method, the mesh size is approximately 1/10 of the spread diameter of the flare, and the flare amount is determined based on the pattern area ratio (the pattern density) in the meshes. A pattern correction is then performed so that each of the patterns in each mesh exposed and formed when the determined flare exists has the desired shape and size. With the spread diameter of the flare being taken into consideration, the accuracy of flare amount estimation is increased through a convolution calculation between the pattern area ratio in each mesh and a Gauss function representing the spread diameter of the flare.

However, the flare generated from reflecting mirrors is scattered over a region of several millimeters to several tens of millimeters. Therefore, the convolution integration between the pattern area density and a flare point spread function involves a very large amount of calculation, resulting in problems such as increases in computer costs and prolongations of calculation time.

Furthermore, the spread of flare is not always represented by Gauss functions. If fitting with the sum of Gauss functions is performed for a calculation, calculation errors become larger, and the accuracy of flare amount estimation becomes lower. If the accuracy of flare amount estimation becomes lower, precise patterns are not formed for semiconductor devices manufactured with the use of a mask pattern corrected to eliminate the impact of flare. As a result, problems such as poorer performance and a lower production yield are caused.

DETAILED DESCRIPTION

Certain embodiments provide a flare correction method. The method can acquire a flare point spread function indicating a relationship between an intensity of flare light convolved into exposing light that has passed through a pattern formed in a mask and a projection optical system, and a distance from the pattern. The method can calculate a pattern density distribution in a first region of the mask, the distance from the pattern being equal to or shorter than a predetermined value in the first region. The method can calculate pattern coverage in a second region of the mask, the distance from the pattern being longer than the predetermined value. The method can calculate a first flare distribution with respect to the pattern by performing convolution integration between the flare point spread function corresponding to the first region and the pattern density distribution. The method can calculate a flare value corresponding to the second region by multiplying a value of integral of the flare point spread function corresponding to the second region by the pattern coverage. The method can calculate a second flare distribution by adding the flare value to the first flare distribution. In addition, the method can correct the pattern based on the second flare distribution.

Hereafter, embodiments of the present invention will be described with reference to the drawings.

First Embodiment

Figure 1:
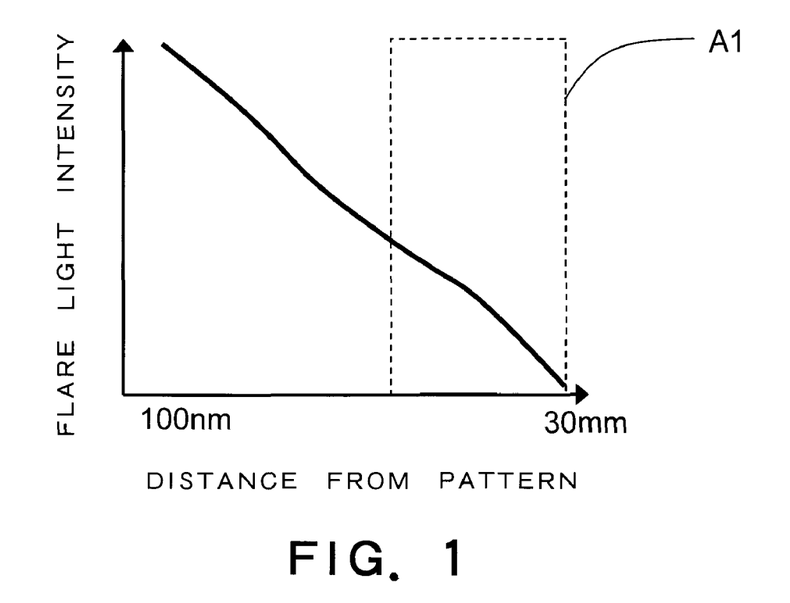
FIG. 1 is a graph showing an example of a flare point spread function.

First, a flare point spread function (PSF) shown in FIG. 1 is described. The graph shown in FIG. 1 is a double logarithmic plot. The abscissa axis indicates the distance from a pattern, and the ordinate axis indicates the intensity of the flare light to be convolved. As can be seen from this graph, the extent affected by the flare ranges from a short distance of approximately 100 nm to a long distance of 30 mm or longer. Since the extent of the impact of flare is 30 mm or longer, it is necessary to prepare a pattern that has a large pattern region, and in some cases, has a reproduced situation where shots (regions to be simultaneously exposed through a single mask) are arranged on a wafer, so as to accurately calculate the flare amount that affects a point in the pattern to be transferred onto the wafer.

However, when the flare amount is calculated with respect to such a large region, the entire pattern region is divided into minute meshes of μm order. The density distribution of the patterns included in all the meshes is calculated, and convolution integration between the density distribution and the flare PSF is performed. This involves an enormous amount of calculations.

Figure 2:
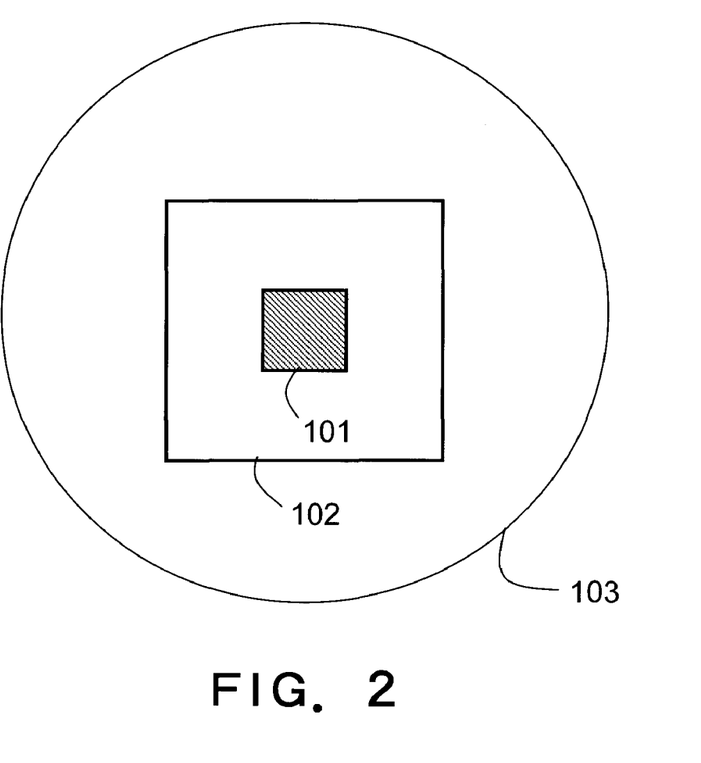
FIG. 2 is a diagram showing an example of divided pattern regions according to a first embodiment.

To counter this problem, this embodiment sets a pattern defining region 102 including a small region (a flare amount calculating region) 101 for calculating the flare amount, as shown in FIG. 2. The pattern density distribution is not calculated in a region 103 outside the pattern defining region 102.

For example, when a large region of 30 mm square (a square of 30 mm on a side) is divided into meshes of 1 μm square, $9 \times 10^8$ meshes are to be handled. If the pattern defining region 102 including the flare amount calculating region 101 is limited to 1 mm square, and this region is divided into meshes of 1 μm square, the number of meshes can be reduced to $1 \times 10^6$.

As for the pattern defining region 102, convolution integration between the pattern density distribution and the flare PSF is performed. As for the region 103 outside the pattern defining region 102, the pattern density of the entire region is calculated, and is multiplied by the value of integral of the flare PSF corresponding to the region. The result of this multiplication is added to the result of the convolution integration.

For example, the region A1 in FIG. 1 indicates the region where the distance from the flare amount calculating region 101 is 1 mm or longer (equivalent to the region 103 in FIG. 2), and this region integrated is equivalent to flare of approximately 4.0%. This implies that, when an infinite-size pattern of 100% in pattern density exists at a distance of 1 mm or longer from the flare amount calculating region 101, flare of 4.0% is convolved into the flare amount calculating region 101.

Accordingly, if the pattern density (also referred to as the coverage) in the entire region at a distance of 1 mm or longer from the flare amount calculating region 101 is 50% (0.5), the flare is 4.0×0.5=2.0%. The flare from the long-distance region A1 (the region 103) is constant in the flare calculating region 101. The convolution integration between the pattern density distribution and the flare PSF is performed on the region (the pattern defining region 102) at a distance of 1 mm or shorter from the flare amount calculating region 101, and the value of the flare from the long-distance region is added to the calculated flare distribution.

For example, the pattern defining region 102 shown in FIG. 2 is 1 mm square, and this region is divided into meshes of 1 μm square. The pattern density in each mesh is then determined, and a pattern density map is created. The convolution integration with the flare PSF excluding the long-distance region A1 of FIG. 1 is then performed. The pattern coverage outside the pattern defining region 102 of FIG. 2 is determined to be 38% (0.38), and 4.0×0.38=1.52% is added to all the meshes of the flare distribution determined through the convolution integration. In this manner, the flare distribution in the flare amount calculating region 101 is determined.

Figure 3:
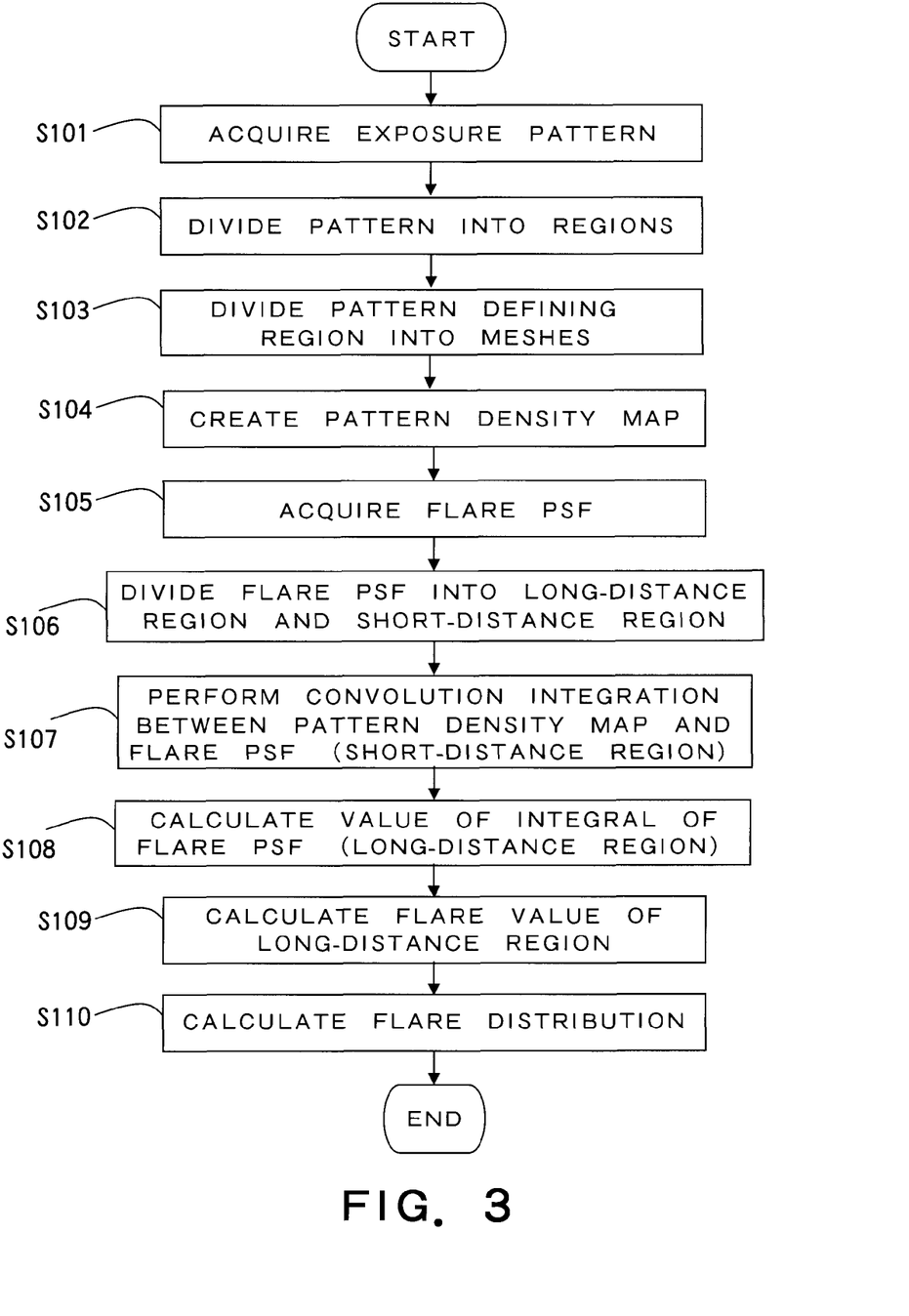
FIG. 3 is a flowchart for explaining a flare calculation method according to the first embodiment.

Referring now to the flowchart shown in FIG. 3, the flow of the flare distribution calculation is described.

(Step S101) An exposure pattern is acquired.

(Step S102) The pattern region is divided. The pattern is divided into the flare amount calculating region 101, the pattern defining region 102, and the region 103 outside the pattern defining region 102, as shown in FIG. 2.

(Step S103) The pattern defining region 102 is divided into meshes.

(Step S104) The pattern density in each mesh is calculated, and a pattern density map (a pattern density distribution) is created.

(Step S105) The flare PSF of the exposure device is acquired.

(Step S106) The flare PSF is divided into a short-distance region corresponding to the pattern defining region 102 and a long-distance region corresponding to the region 103 outside the pattern defining region 102.

Figure 4A:
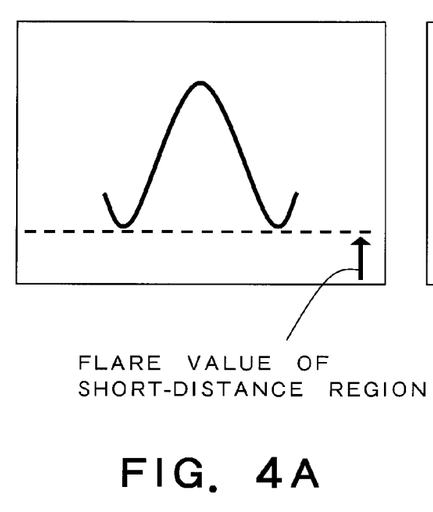
FIG. 4A is a diagram showing an example of a flare distribution.

(Step S107) The convolution integration between the pattern density map created at step S104 and the flare PSF (the short-distance region) is performed. Through this convolution integration, the flare amount in each mesh in the flare calculating region 101 is calculated. This is calculated as the flare amount by virtue of the flare PSF of the short-distance region components that lifts up the optical image of the patterns in a mesh (the light intensity distribution on the wafer), as indicated by the arrow in FIG. 4A.

(Step S108) The value of integral of the long-distance region of the flare PSF is calculated.

(Step S109) The value of flare from the long-distance region is calculated by multiplying the pattern density (the coverage) in the entire region 103 by the value of integral calculated in step S108.

Figure 4B:
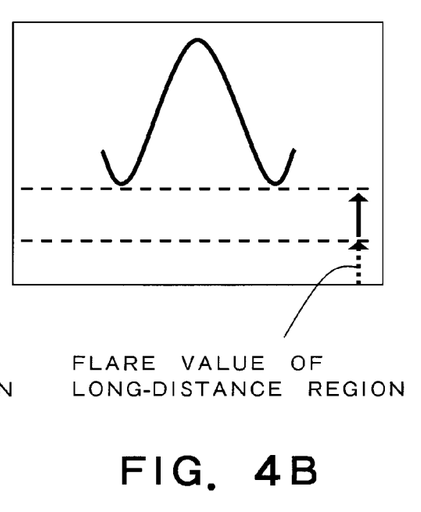
FIG. 4B is a diagram showing an example of a flare distribution.

(Step S110) The value of flare calculated in step S109 is added to the result of the convolution integration performed in step S107. In this manner, the flare amount in each mesh is determined as shown in FIG. 4B.

As described above, in this embodiment, the region where the convolution integration between the pattern density map and the flare PSF is limited to the pattern defining region 102, and the impact of the region 103 outside the pattern defining region 102 is separately determined as a constant flare value, and is then added.

When a large area of 30 mm square is divided into meshes of 1 μm square, $9 \times 10^8$ meshes are to be handled, for example. However, when the region (the pattern defining region) to be divided into meshes is limited to 1 mm square, and this region is divided into meshes, the number of meshes can be reduced to $1\times10^6$, which is approximately $\frac{1}{1000}$ of $9\times10^8$.

In this embodiment, the region where the convolution integration between the flare PSF and the pattern density map is performed is limited to a small region, so that the time required for calculating the flare distribution can be greatly shortened. Also, the impact of the region outside this small region (the region farther away from the region to be subjected to the flare distribution calculation) is separately calculated as a constant flare value, so that the accuracy of calculation of the mask-pattern-dependent flare amount can be maintained. Accordingly, the flare distribution can be accurately calculated at a high speed.

Also, with the use of this flare distribution, a flare correction can be accurately performed at a high speed. Furthermore, with the use of a mask pattern subjected to the flare correction, a mask can be produced in an early stage, and the periods of semiconductor device development and manufacture can be shortened. Also, since the accuracy of the flare correction is high, a precise pattern is formed for each semiconductor device, and problems such as performance deterioration and a decrease in production yield can be prevented.

Second Embodiment

This embodiment further limits the region where the convolution integration between the flare PSF and the pattern density map is performed, compared with the first embodiment. In this embodiment, in the flare PSF shown in FIG. 5, the region A2 close to the flare amount calculating region, as well as the region A1 farther away from the flare amount calculating region, is excluded from the convolution integration region.

In this region A2, to obtain a desired shape and size when the exposing light from the mask used is transferred onto the wafer, an optical proximity-effect correction (OPC) is performed to correct the mask pattern. At this point, a flare correction using a flare map can be included in the correction contents in the OPC.

For example, the amount of flare light at the location of the pattern to be corrected is referred to in a generated flare map, and an optical image to be formed by the mask pattern is calculated on the assumption that such flare light exists. When the optical image is calculated, the region included in the optical radius (normally around 1 µm) as the calculation region for one time in the OPC is not included in the calculation of the flare amount, and the optical image in the existence of flare is calculated by taking the flare PSF in the region into consideration.

Figure 5:
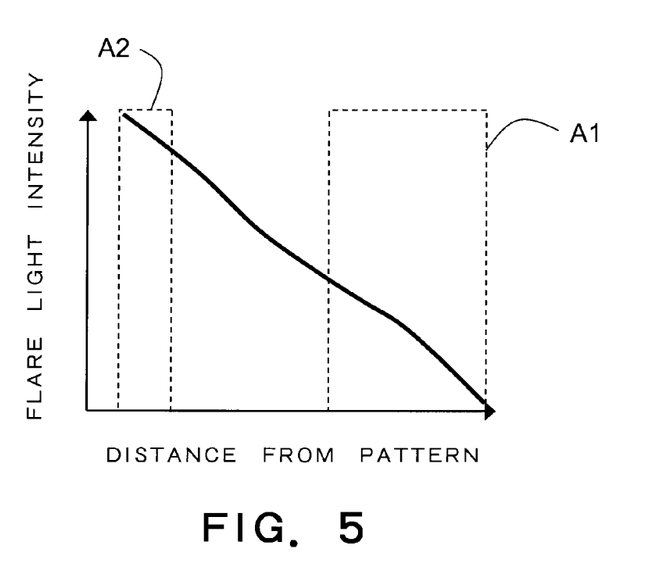
FIG. 5 is a graph showing an example of a flare point spread function.
Figure 6:
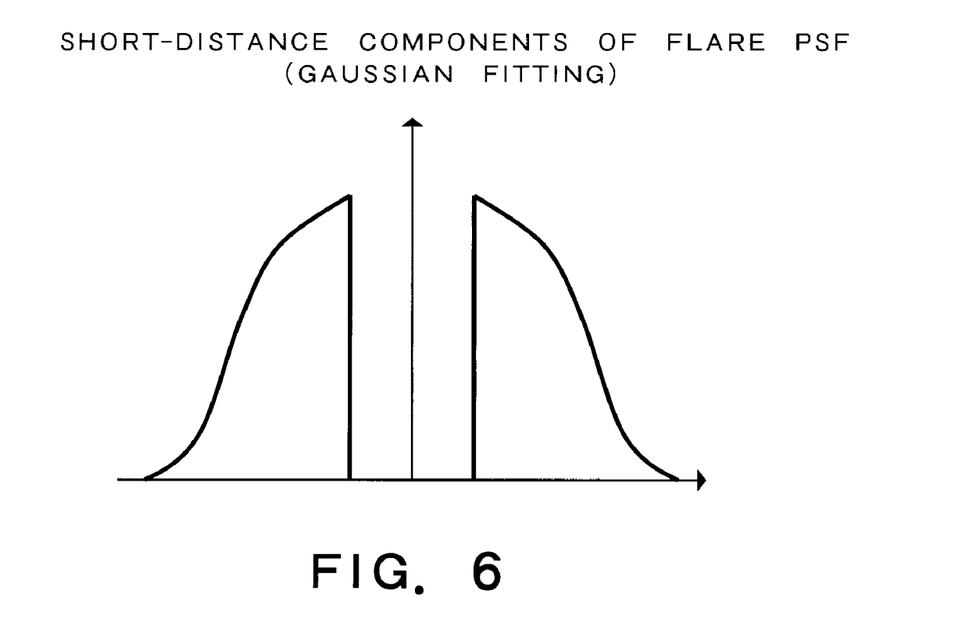
FIG. 6 is a graph showing a flare point spread function having the short-distance region substituted by a Gauss function.

The flare PSF in the short-distance region A2 of FIG. 5 can be substituted by a Gauss function as shown in FIG. 6, for example. The convolution integration between a Gauss function and another function can be readily performed by carrying out a Fourier transform, and calculations involving convolution integration with various Gauss functions are also performed in actual OPCs. Therefore, the load of calculation on OPCs is not large, and the convolution integration with a Gauss function can be readily performed in the OPC process.

As described above, by excluding the region smaller than the optical radius of the OPC from the region of the convolution integration between the flare PSF and the pattern density map, the amount of calculation in the convolution integration can be further reduced.

For example, if the excluded region is a region at a distance of 1 µm or shorter from the flare PSF pattern, the proximity region with the highest degree of contribution to the flare light can be included in the OPC. Furthermore, the mesh size of the pattern density map is 1 µm square or larger, and sufficient accuracy can be secured in the flare calculation.

Conventionally, the accuracy of a flare correction by a mapping technique is determined by the mesh size of the map. To achieve sufficient correction accuracy, the mesh size tends to become smaller. A regular flare PSF has a larger degree of contribution to the flare amount, as the distance from the pattern is shorter. To achieve correction accuracy of nanometer order, it is necessary to perform a flare correction with meshes smaller than 1 µm square. Therefore, the time required for calculating a flare map might become long even by the method according to the first embodiment. However, by the method according to this embodiment, the accuracy of the flare amount calculation can be made higher, and, at the same time, a prolongation of the flare map calculation time can be prevented.

Third Embodiment

Figure 7:
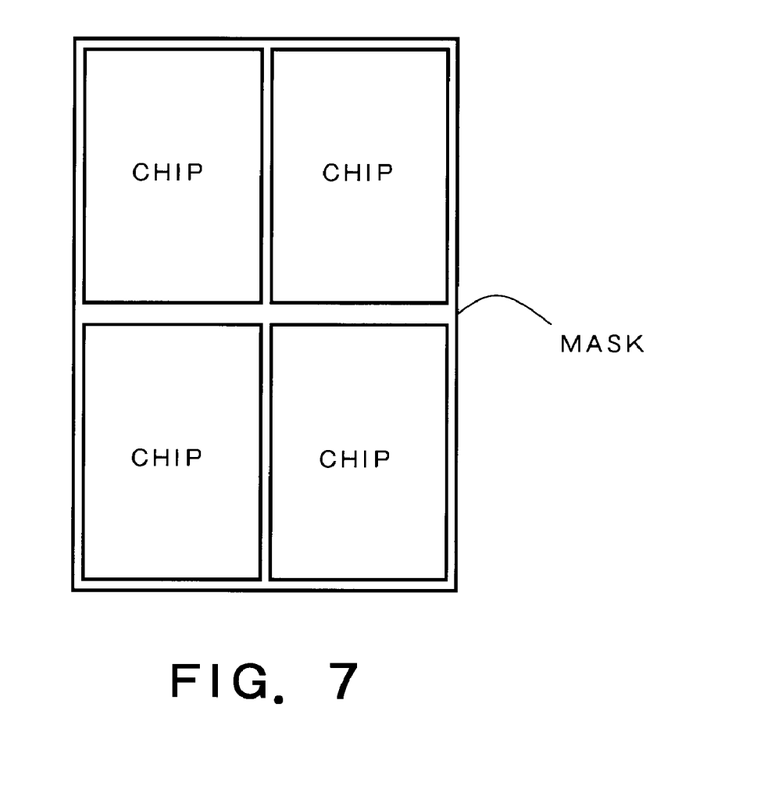
FIG. 7 is a diagram showing an example of a multi-chip forming mask.

This embodiment relates to a flare correction to be performed on a multi-chip forming mask pattern shown in FIG. 7. This mask includes four patterns for forming identical semiconductor devices (chips). In other words, the patterns of four devices can be transferred by exposing this mask pattern to light only once, and this mask serves as a four-chip forming mask.

Figure 8:
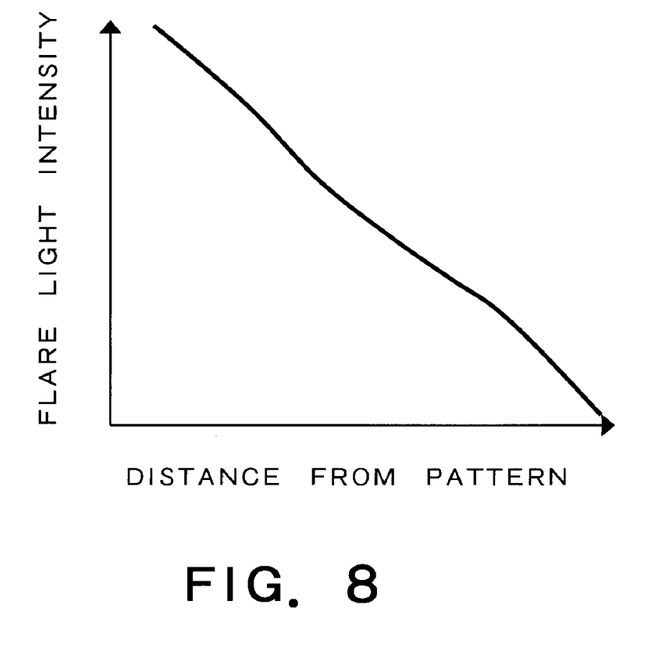
FIG. 8 is a graph showing an example of a flare point spread function.

The flare PSF shown in FIG. 8 is used for the flare prediction performed at the time of the flare correction. The impact distance of this flare PSF is several tens of millimeters. Meanwhile, the size of the entire mask is normally 26 mm×33 mm at a maximum when converted into a size on the substrate onto which the patterns are to be transferred, and the size of one chip is approximately 12 mm×16 mm, which is also a size on the substrate.

Figure 9A:
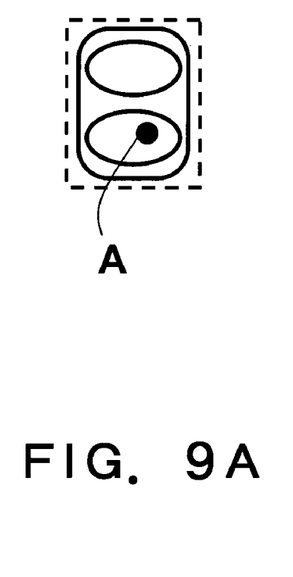
FIG. 9A is a diagram showing an example of a flare distribution.

First, a flare map is calculated with respect to only one chip included in the mask pattern shown in FIG. 7. As a result, a flare distribution represented by contour lines is obtained as shown in FIG. 9A. On the other hand, when a flare map is calculated with respect to the entire mask, the distribution shown in FIG. 9B is obtained.

The mesh size of the flare map is approximately 1 µm square. If the extent affected by the flare PSF is sufficiently smaller than the chip size, identical flare distributions are obtained with respect to all the chips in the mask. However, when the flare map of the entire mask is determined with the use of the flare PSF shown in FIG. 8, the flare amount varies between the points A' and A" corresponding to the point A of FIG. 9A, when seen in each chip.

Figure 9B:
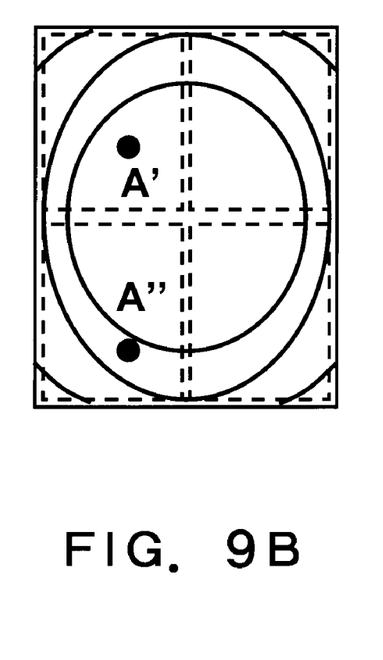
FIG. 9B is a diagram showing an example of a flare distribution.

Therefore, in the regular flare correction method, a flare correction is performed on the entire mask pattern with the use of the flare map of the entire mask as shown in FIG. 9B. In a flare correction method using a flare map, the amount of flare existing at the location of the pattern to be corrected is read from the flare map, and the optical image to be transferred onto the substrate when the flare amount exists is calculated. The mask pattern is adjusted so that the patterns each having the optical image in a desired shape and size can be transferred. This pattern correction is repeated over the entire patterns. This is called a model-based correction method.

In a simpler correction method, the optical image at a location in the pattern to be corrected is not calculated, and the patterns are corrected only for the amount of correction in the mask pattern corresponding to the existing flare amount that has been calculated in advance. This is called a rule-based correction method.

However, to apply the rule-based correction to all the patterns, it is necessary to determine the rules that apply to an enormous number of combinations and determine the amount of correction at each time. Furthermore, since the rules are difficult in patterns of complicated shapes such as two-dimensional shapes, the accuracy of rule-based corrections is lower than the accuracy of model-based corrections.

Table 1 shows examples of calculations performed in a case where flare maps are created for all the patterns in the mask through convolution integrations with the flare PSF, and a model-based correction is performed on each minute region (approximately 1 μm square or smaller). Here, the mesh size of the flare map is 1 μm square, and the mesh size in the flare correction is 0.1 μm square.

TABLE 1

| | only 1 chip | entire mask | calculation amount comparison (entire mask/only 1 chip) |
|---|---|---|---|
| number of meshes for which a pattern density map is created | 12,000 × 16,000 | 26,000 × 33,000 | approximately 4.5-fold |
| flare map creation time | | proportional to square of number of meshes for which a pattern density map is created | approximately 20-fold |
| number of meshes subjected to flare correction | 120,000 × 160,000 | 260,000 × 330,000 | approximately 4.5-fold |
| total | | | approximately 400-fold |

As can be seen from Table 1, if the entire mask is calculated by the same method and with the same accuracy for the flare correction on one chip having identical pattern shapes, the calculation amount becomes approximately 400 times larger. Accordingly, the time required for the flare correction also becomes 400 times longer. In other words, if the subject of the model-based flare correction can be limited to one chip in the mask, the time required for the correction can be reduced to 1/400.

After a model-based flare correction is performed on the mask pattern of one chip, the patterns subjected to the flare corrections are arranged as shown in FIG. 7. However, if the positions of the chips vary as shown in FIG. 9B, the flare amounts at the respective points might vary. Therefore, the flare map shown in FIG. 9B is first created. At this point, the mesh size is made as large as approximately 100 μm square. With this arrangement, in the flare map of the entire mask, the number of meshes becomes as small as 260×330. Accordingly, the calculation amount becomes smaller, and a prolongation of the calculation time can be prevented.

Figure 10:
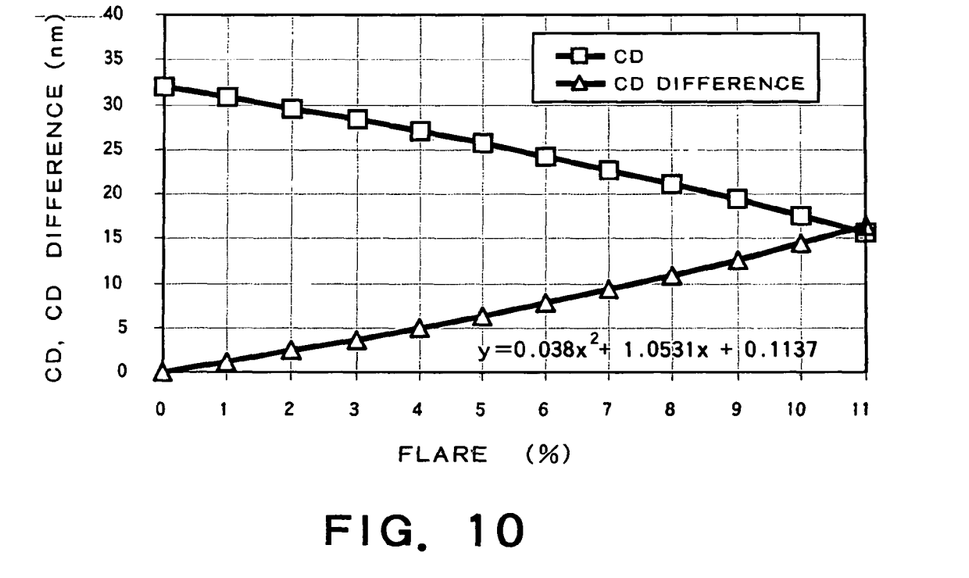
FIG. 10 is a graph showing the relationship between the flare amount and the pattern size.

Also, by performing experiments and simulations beforehand, the relationship between the flare amount and the pattern size variation is determined as shown in FIG. 10. FIG. 10 shows the calculation results of simulations performed where a line and space (L/S) pattern of a target size of 32 nm is formed. The abscissa axis indicates the flare amount. While the pattern size (CD) is 32 nm when flare does not exist, the pattern size (CD) is 17.6 nm when 10% flare exists. The CD differences from the target size (or the size variation) are plotted, so that the size variation with respect to the flare amount can be calculated by a regression calculation.

Figure 11:
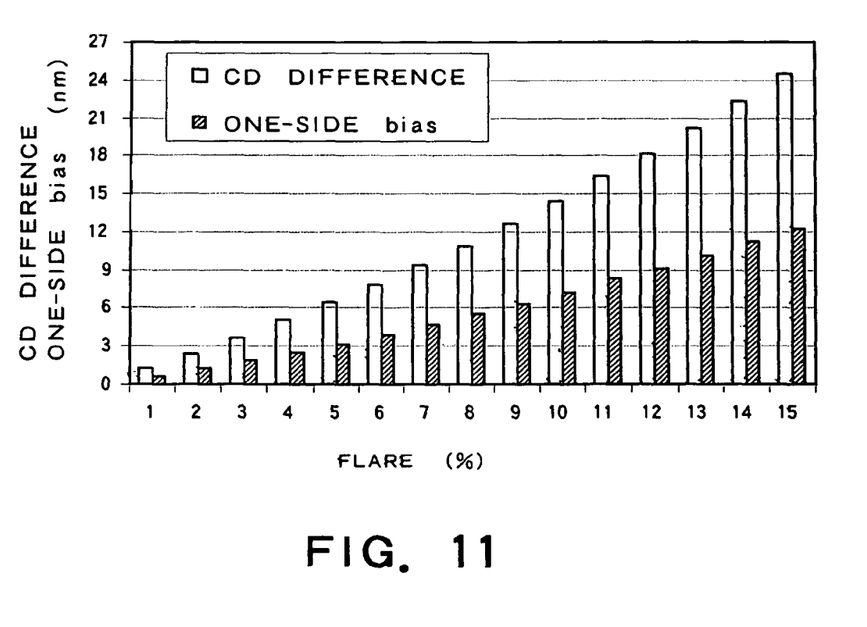
FIG. 11 is a graph showing the relationship between the flare amount and the pattern resizing amount.

Based on the result, the pattern resizing amounts to compensate for the size variation with respect to the flare amount are determined, as shown in FIG. 11. In the example shown in FIG. 11, the resizing amounts or the correction amounts are represented in the form of the bias amounts of the respective sides of the patterns, because the patterns are corrected to become thicker. In this manner, the correction amounts are defined as a table or function with respect to the flare amount.

In a case where the patterns of one chip subjected to the flare correction are arranged on a multi-chip forming mask according to the arrangement information related to the chip, a flare distribution different from the flare map calculated for the one chip exists in the entire mask. The patterns in each mesh (100 μm square in size) of the flare map of the entire mask calculated beforehand are subjected to pattern resizing according to the flare amounts in the meshes, so as to perform a rule-based flare correction. In this manner, a flare correction can be performed on the entire mask.

Figure 12:
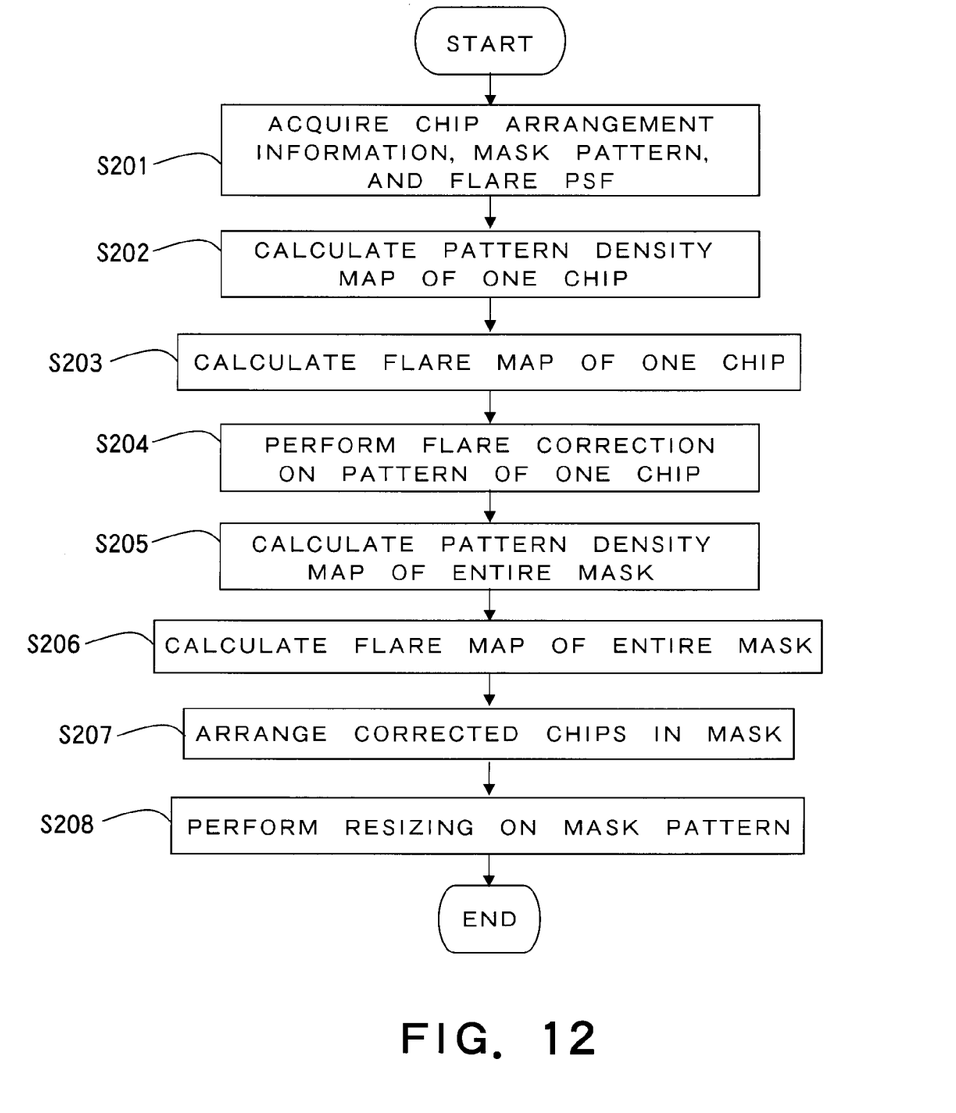
FIG. 12 is a flowchart for explaining a flare correction method according to a third embodiment.

Referring now to the flowchart shown in FIG. 12, this flare correction method is described.

(Step S201) The chip arrangement information about a multi-chip forming mask, and the mask pattern and the flare PSF of one chip are acquired.

(Step S202) The mask pattern of one chip is divided into meshes, the pattern density in each of the meshes is determined, and a pattern density map is calculated.

(Step S203) The convolution integration between the pattern density map calculated in step S202 and the flare PSF is performed, so as to calculate the flare map of one chip.

(Step S204) A model-based correction (a flare correction) is performed on the flare map calculated in step S203, to acquire a corrected pattern of one chip.

(Step S205) The entire mask is divided into meshes, the pattern density in each of the meshes is determined, and a pattern density map is calculated. The meshes in this step are larger than the meshes in step S202.

(Step S206) The convolution integration between the pattern density map calculated in step S205 and the flare PSF, to calculate the flare map of the entire mask.

(Step S207) The corrected patterns of one chip obtained in step S204 are arranged in the mask, based on the chip arrangement information.

(Step S208) With the use of the mask pattern determined in step S207 and the flare map determined in step S206, the pattern resizing corresponding to the flare amount in each mesh is performed, so as to perform a rule-based flare correction. In the pattern resizing, the predetermined relationship between the flare and the pattern correction amount shown in FIG. 11 is referred to. In this manner, a mask pattern subjected to the flare correction can be obtained.

As described above, in the flare correction method according to this embodiment, a model-based flare correction of one chip is performed, and the flare correction on the patterns of the entire mask is performed by resizing the flare-corrected patterns of the one chip.

Accordingly, the calculation amount required for performing a precise flare correction can be reduced. Also, by performing simple graphical processing that is the pattern resizing, a flare correction can be performed on the entire mask pattern, and accordingly, the time required for performing the flare correction on the entire mask pattern can be dramatically shortened.

As described above, by shortening the time required for the flare correction, the data for producing the masks that are necessary in manufacturing semiconductor devices can be released in an earlier stage, and the lead time before the mask production can be shortened. Also, since the model-based flare correction on the entire mask becomes unnecessary, the investment in the computers for performing flare corrections can be reduced, and the costs of development of semiconductor device products can be lowered.

Fourth Embodiment

In the above described third embodiment, the regions outside the chips and outside the mask are not taken into consideration in the calculation of the flare map of only one chip and in the calculation of the flare map of the entire mask. In this embodiment, on the other hand, the regions outside the chips and outside the mask are taken into consideration when a flare map is calculated, so as to further increase the accuracy of the flare correction.

As shown in FIG. 7, identical chips exist adjacent to each another at a predetermined interval. When the patterns for manufacturing semiconductor devices with the use of this mask are transferred onto a substrate, the transfer is performed so that the patterns corresponding to the region of the mask are arranged at certain intervals. Therefore, identical chips adjacent to each other are exposed.

Therefore, in the procedure for calculating the flare map of one chip (step S203) according to the third embodiment, an adjacent chip is assumed to be there. At this point, the range affected by the flare PSF is set at a distance $R_{max}$ from the pattern.

Figure 14A:
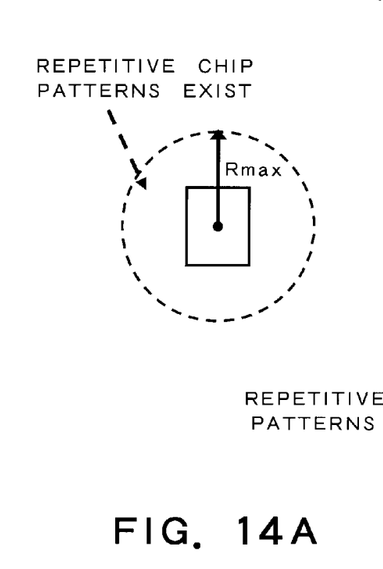
FIG. 14A is a diagram showing an example of the extent of an impact of the flare point spread function.

For example, in the procedure for calculating the flare map of one chip, $R_{max}$ is set at a length substantially equal to the diagonal line of the chip, as shown in FIG. 14A. Since the length of the diagonal line of each chip in the example described in the third embodiment is 20 mm, $R_{max}$ is set at 20 mm. However, the calculated flare map has the same number of meshes as that in the third embodiment.

Figure 14B:
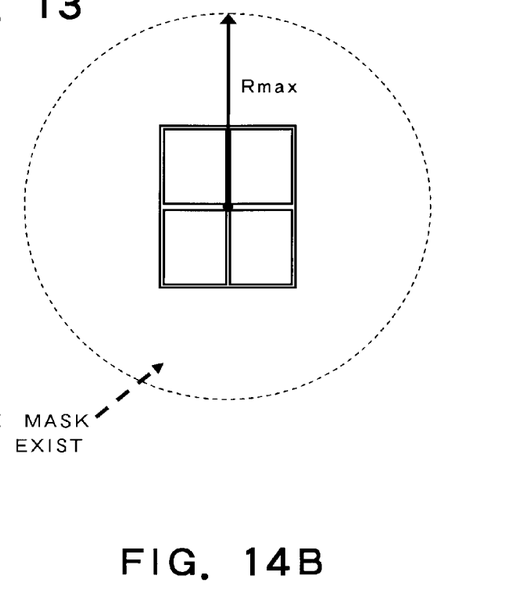
FIG. 14B is a diagram showing an example of the extent of an impact of the flare point spread function.

In the calculation of the flare map of the entire mask, the flare map is calculated on the assumption that an identical mask exists adjacent to the mask. In this case, the extent of the impact of the flare PSF is substantially equal to the length of the diagonal line of the mask, and $R_{max}$ is set at 42 mm, as shown in FIG. 14B. Here, the flare map also has the same number of meshes as that in the third embodiment.

The pattern defining region sizes to be considered in the formation of flare maps in this embodiment are shown in Table 2.

TABLE 2

|  | Width(mm) | Height(mm) | calculation amount |
|---|---|---|---|
| one chip | 12 + 20 × 2 = 52 | 16 + 20 × 22 = 56 | approximately 15-fold |
| entire mask | 26 + 42 × 2 = 66 | 33 + 42 × 2 = 73 | approximately 15-fold |

Accordingly, compared with the third embodiment, the calculation amount of one chip becomes approximately 15 times larger, and the calculation amount of the entire mask becomes approximately 15 times larger. The calculation regions of the flare maps have the chip size and the mask size, which is the same as in the third embodiment. Therefore, each calculation amount does not increase to the square of the number of meshes.

In practice, since a long period of time is required for performing a model-based flare correction, the time required for the flow of the entire flare correction does not increase as much as several times, and the correction can be performed in a shorter period of time than the model-based flare correction on the entire mask pattern. Since the flare maps are calculated in circumstances similar to an actual exposure, the accuracy of the flare correction becomes higher than that in the third embodiment.

As described above, by the flare correction method according to this embodiment, a flare correction can be performed with higher accuracy and at a higher speed. Also, the data for producing the masks necessary for manufacturing semiconductor devices are released in an earlier stage, and the lead time before the mask production can be shortened. Accordingly, the semiconductor device products can be put on the market. Furthermore, there is no need to perform a model-based flare correction on the entire mask. Accordingly, the investment in computers for performing flare corrections can be reduced, and the costs of development of semiconductor device products can be lowered.

Fifth Embodiment

This embodiment is to perform an exposure of a pattern onto a processed substrate with high precision, with the use of a mask that is subjected to the flare correction according to the third or fourth embodiment.

A mask pattern subjected to the flare correction by the method according to the fourth embodiment is formed on the assumption that there exists an adjacent transfer pattern, when exposures are repeatedly performed on the entire surface of the processed substrate. As a result, a difference is caused in the transfer position on the substrate between a case where an adjacent transfer pattern exists and a case where there is not an adjacent transfer pattern.

Figure 15:
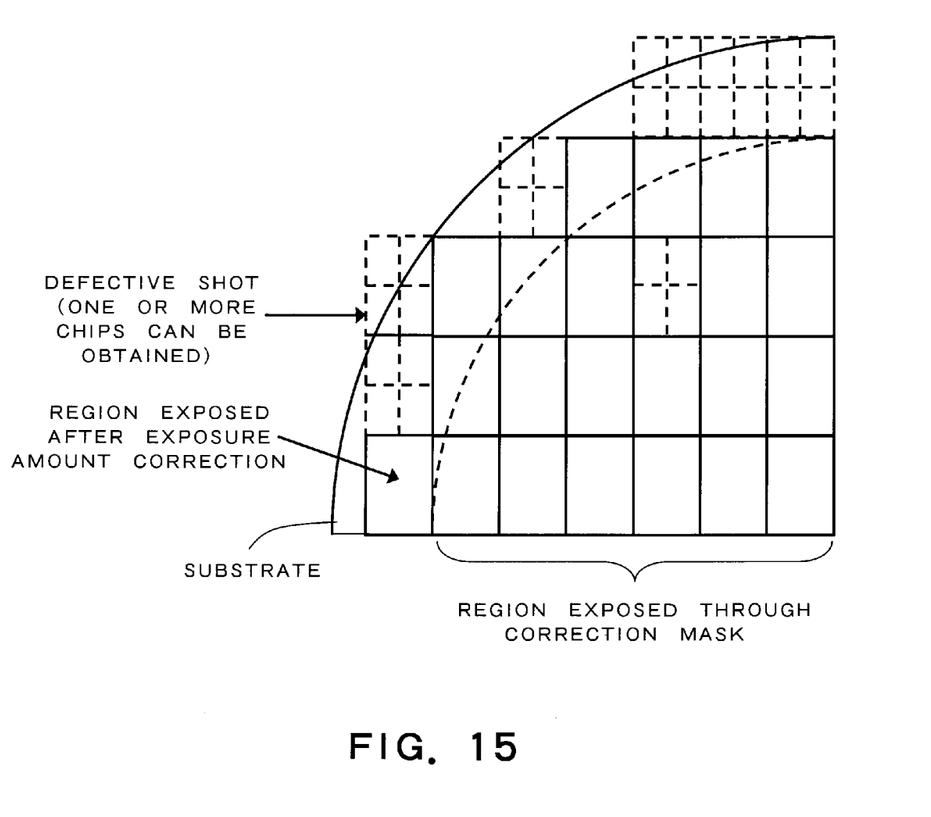
FIG. 15 is a diagram showing an example of shots at the outer circumferential portion of a substrate.

For example, as shown in FIG. 15, there is not a transfer pattern adjacent to the patterns transferred in the vicinity of the outer circumferential portion of the substrate. Therefore, the predicted flare from transfer patterns adjacent to the patterns transferred in the vicinity of the outer circumferential portion does not exist, and the patterns are formed with a smaller exposure dosage than the estimated exposure dosage. As a result, the correction amount becomes insufficient in the patterns formed in the vicinity of the outer circumferential portion even if a flare correction has been performed, and patterns of a desired size cannot be formed.

To counter this problem, the exposure dosage is adjusted in outer circumferential regions, or more particularly, in regions substantially equal to the length of the diagonal line of the mask pattern outside the transfer substrate. In this manner, the transferred pattern with the desired size is obtained. However, patterns that are called defective shots are set to be exposed, as shown in FIG. 15. In the corresponding region, each of the patterns in the mask is partially not transferred onto the substrate, but one or more chips in each of the patterns can be transferred.

If there exists a region where the mask pattern is not transferred, for some reason, onto an area having an even larger outer circumference, such a region is located at a distance substantially equal to the length of the diagonal line of the mask pattern from the outermost circumference of the patterns to be transferred.

In this embodiment, flare maps are created as in the third and fourth embodiments. The objects for which flare maps are created are regions on transfer substrates, including as far as the outer circumferential portions of wafers. Here, the sizes of meshes in flare maps may not be very small. If a flare map is created on the entire surface of a substrate of 300 mm in diameter, with the mesh size being 1 mm square, the number of meshes becomes approximately 70 thousands.

In practice, if the exposure dosage is controlled in a region of approximately 40 mm in outer circumference, regions inside a substrate of approximately 40 mm becomes regions to be taken into consideration at the time of each flare map calculation. Accordingly, the area of the subject regions becomes $\{150^2-(150-40\times2)^2\}\times\pi=55292$ mm$^2$, and the number of meshes becomes approximately 55 thousands.

Figure 13:
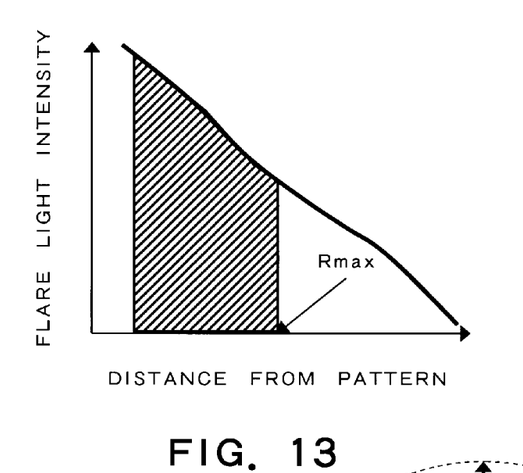
FIG. 13 is a graph showing an example of a flare point spread function.

A pattern density map of this region is created, and a flare map is calculated by performing convolution integration with the flare PSF shown in FIG. 13. Before a pattern transfer is performed, the resizing amounts shown in FIG. 11 are referred to, based on the flare amount of each mesh indicated in the flare map. The patterns are then transferred with such an exposure dosage as to achieve a desired pattern linewidth. The control on the exposure dosage at that point is performed to achieve an optimum exposure dosage for each 1 mm square region within the exposure face of the exposure device.

Also, in a case where patterns are transferred with the use of a mask subjected to a flare correction by the method according to the third embodiment, exposure dosage control is performed in the same manner as above, with the use of a flare map of the entire surface of the substrate. The patterns are then exposed on the entire surface of the substrate. In this manner, a pattern transfer can be performed with desired dimensional precision.

Even in a pattern transfer to a location where the exposure dosage is not sufficient only through a flare correction on the mask pattern, a flare map is created based on the arrangement layout of the mask pattern to be transferred onto a substrate (equivalent to the shots), and the patterns can be transferred with such an exposure dosage as to achieve a desired size for each of the meshes in the flare map. In other words, patterns that cannot be completely corrected by a flare correction on the mask pattern can be corrected by controlling the exposure dosage.

As described above, according to this embodiment, a pattern can be transferred in such a manner as to achieve a desired size on the entire surface of a processed substrate, the dimensional precision of the patterns is increased, and the production yield of semiconductor device products can be further increased.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A flare correction method comprising:
   acquiring a flare point spread function indicating a relationship between an intensity of flare light convolved into exposing light that has passed through a pattern formed on a mask and a projection optical system, and a distance from the pattern;
   calculating a pattern density distribution in a first region of the mask, the distance from the pattern being equal to or shorter than a predetermined value in the first region;
   calculating pattern coverage in a second region of the mask, the distance from the pattern being longer than the predetermined value;
   calculating a first flare distribution with respect to the pattern by performing convolution integration between the flare point spread function corresponding to the first region and the pattern density distribution in the first region;
   calculating a flare value corresponding to the second region by multiplying a value of integral of the flare point spread function corresponding to the second region by the pattern coverage;
   calculating a second flare distribution by adding the flare value to the first flare distribution; and
   correcting the pattern based on the second flare distribution.

2. The flare correction method according to claim 1, wherein the pattern density distribution is created by dividing the first region into meshes, and calculating a pattern density in each of the meshes.

3. The flare correction method according to claim 1, wherein the first flare distribution is calculated by performing convolution integration between the flare point spread function corresponding to a fourth region and the pattern density distribution corresponding to the fourth region, the fourth region being obtained by excluding a third region from the first region, the distance from the pattern in the third region being equal to or shorter than an optical radius that is a calculation region of each calculation in an optical proximity-effect correction.

4. The flare correction method according to claim 3, wherein the pattern density distribution corresponding to the fourth region is created by dividing the fourth region into meshes, and calculating a pattern density in each of the meshes in the fourth region.

5. The flare correction method according to claim 4, wherein a mesh size of each of the meshes in the fourth region is equal to or larger than a size of the third region.

6. A method for manufacturing a mask for lithography, comprising manufacturing the mask with the use of a mask pattern corrected by the flare correction method according to claim 1.

7. A method for manufacturing a semiconductor device, comprising forming a pattern on a semiconductor substrate by performing an exposure with the use of a mask having a mask pattern corrected by the flare correction method according to claim 1.

8. A flare correction method comprising:
   acquiring a flare point spread function indicating a relationship between an intensity of flare light convolved into exposing light that has passed through a pattern formed on a mask in a projection optical system, and a distance from the pattern;
   calculating a first pattern density distribution by dividing one chip of a plurality of identical chips formed on the mask into first meshes, and determining a first pattern density in each of the first meshes, where each of the first meshes has a first size;
   calculating a first flare distribution of the one chip by performing convolution integration between the first pattern density distribution and the flare point spread function;
   calculating a first correction pattern by performing a model-based correction on patterns in the one chip, based on the first flare distribution;
   calculating a second pattern density distribution by dividing the mask into second meshes, and determining a second pattern density in each of the second meshes, where each of the second meshes has a second size;
   calculating a second flare distribution of the mask by performing convolution integration between the second pattern density distribution and the flare point spread function; and
   calculating a second correction pattern by performing a rule-based correction on a mask pattern in which are arranged patterns of the identical chips having the first correction pattern of the one chip, based on the second flare distribution.

9. The flare correction method according to claim 8, wherein a pattern resizing amount is determined based on a correspondence relationship between a flare amount and a pattern size variation in the rule-based correction, and the second correction pattern is calculated by adding the pattern resizing amount to the first correction pattern.

10. The flare correction method according to claim 8, wherein the first flare distribution is calculated by performing convolution integration in a region where a distance from a center of the one chip is equal to or shorter than a diagonal line of the one chip.

11. The flare correction method according to claim 8, wherein the second flare distribution is calculated by performing convolution integration in a region where a distance from a center of the mask is equal to or shorter than a diagonal line of the mask.

12. A method for manufacturing a semiconductor device by forming a pattern on a semiconductor substrate through an exposure with the use of a mask having a mask pattern corrected by the flare correction method according to claim 8, the method for semiconductor device manufacturing comprising:

creating a flare map based on an arrangement layout of the corrected mask pattern to be transferred onto the semiconductor substrate; and controlling an exposure dosage based on the flare map.

* * * * *